(12) United States Patent
Heo et al.

(10) Patent No.: US 8,378,362 B2
(45) Date of Patent: Feb. 19, 2013

(54) ORGANIC LIGHT EMITTING DIODE DISPLAY AND METHOD OF MANUFACTURING THE SAME

(75) Inventors: Jeonghaeng Heo, Kyungbuk (KR); Hyunsuk Kim, Daegu (KR); Jinho Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 88 days.

(21) Appl. No.: 12/779,512

(22) Filed: May 13, 2010

(65) Prior Publication Data

US 2011/0031511 A1 Feb. 10, 2011

(30) Foreign Application Priority Data

Aug. 5, 2009 (KR) .................. 10-2009-0072068

(51) Int. Cl.
*H01L 51/52* (2006.01)

(52) U.S. Cl. ....... 257/88; 257/94; 257/87; 257/E51.018; 257/E33.062; 438/34

(58) Field of Classification Search .............. 257/88, 257/94, 87, E51.018, E33.062; 438/34
See application file for complete search history.

(56) References Cited

U.S. PATENT DOCUMENTS

| | | | | |
|---|---|---|---|---|
| 2007/0046179 | A1* | 3/2007 | Chang et al. | 313/504 |
| 2007/0131948 | A1* | 6/2007 | Seo et al. | 257/87 |
| 2009/0078946 | A1* | 3/2009 | Jeong et al. | 257/94 |
| 2009/0230854 | A1* | 9/2009 | Kim et al. | 313/504 |
| 2010/0219404 | A1* | 9/2010 | Endo et al. | 257/40 |

* cited by examiner

*Primary Examiner* — Marc Armand
(74) *Attorney, Agent, or Firm* — Morgan, Lewis & Bockius LLP

(57) ABSTRACT

An organic light emitting diode display and a method of manufacturing the same are disclosed. The organic light emitting diode display includes a substrate, a first electrode positioned on the substrate, an organic light emitting layer positioned on the first electrode, and a second electrode positioned on the organic light emitting layer. The organic light emitting layer includes an inorganic oxide layer between a light emitting layer and a common layer.

2 Claims, 6 Drawing Sheets

ORGANIC LIGHT EMITTING DIODE DISPLAY AND METHOD OF MANUFACTURING THE SAME

This application claims the benefit of Korean Patent Application No. 10-2009-0072068 filed on Aug. 5, 2009, the entire contents of which is incorporated herein by reference for all purposes as if fully set forth herein.

BACKGROUND OF THE INVENTION

1. Field of the Invention

Embodiments of the invention relate to an organic light emitting diode display and a method of manufacturing the same.

2. Discussion of the Related Art

An organic light emitting element used in an organic light emitting diode (OLED) display has a self-emission structure in which a light emitting layer is formed between two electrodes. The organic light emitting element injects electrons from a cathode corresponding to an electron injection electrode and holes from an anode corresponding to an hole injection electrode into the light emitting layer and emits light when an exciton formed by a combination of the injected electrons and the injected holes falls from an excitation level to a ground level.

The OLED display using the organic light emitting element may be classified into a top emission type OLED display, a bottom emission type OLED display, and a dual emission type OLED display depending on an emitting direction of light. The OLED display may be classified into a passive matrix type OLED display and an active matrix type OLED display depending on a driving manner.

In the OLED display, when a scan signal, a data signal, a power, etc. are supplied to a plurality of subpixels arranged in a matrix form, selected subpixels of the plurality of subpixels emit light to thereby display an image.

Each of the subpixels includes a transistor unit including a switching transistor, a driving transistor, and a capacitor and an organic light emitting diode including a lower electrode connected to the driving transistor of the transistor unit, an organic light emitting layer, and an upper electrode. The organic light emitting layer generally includes a hole injection layer, a hole transfer layer, a light emitting layer, a electron transfer layer, and an electron injection layer, so as to facilitate an injection and a transfer of electrons and holes. In a related art organic light emitting layer, as it is easy to transfer energy in an interface between a light emitting layer and a hole transfer layer, a light emitting efficiency and lifetime of the OLED display are reduced because of an energy loss of triplet inside the OLED display.

SUMMARY OF THE INVENTION

In one aspect, there is an organic light emitting diode display comprising a substrate, a first electrode positioned on the substrate, an organic light emitting layer positioned on the first electrode, the organic light emitting layer including an inorganic oxide layer between a light emitting layer and a common layer, and a second electrode positioned on the organic light emitting layer.

In another aspect, there is a method of manufacturing an organic light emitting diode display comprising forming a first electrode on a substrate, forming an organic light emitting layer on the first electrode, and forming a second electrode on the organic light emitting layer, wherein the forming of the organic light emitting layer includes forming an inorganic oxide layer between a light emitting layer and a common layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail embodiments of the invention examples of which are illustrated in the accompanying drawings.

Figure 1:
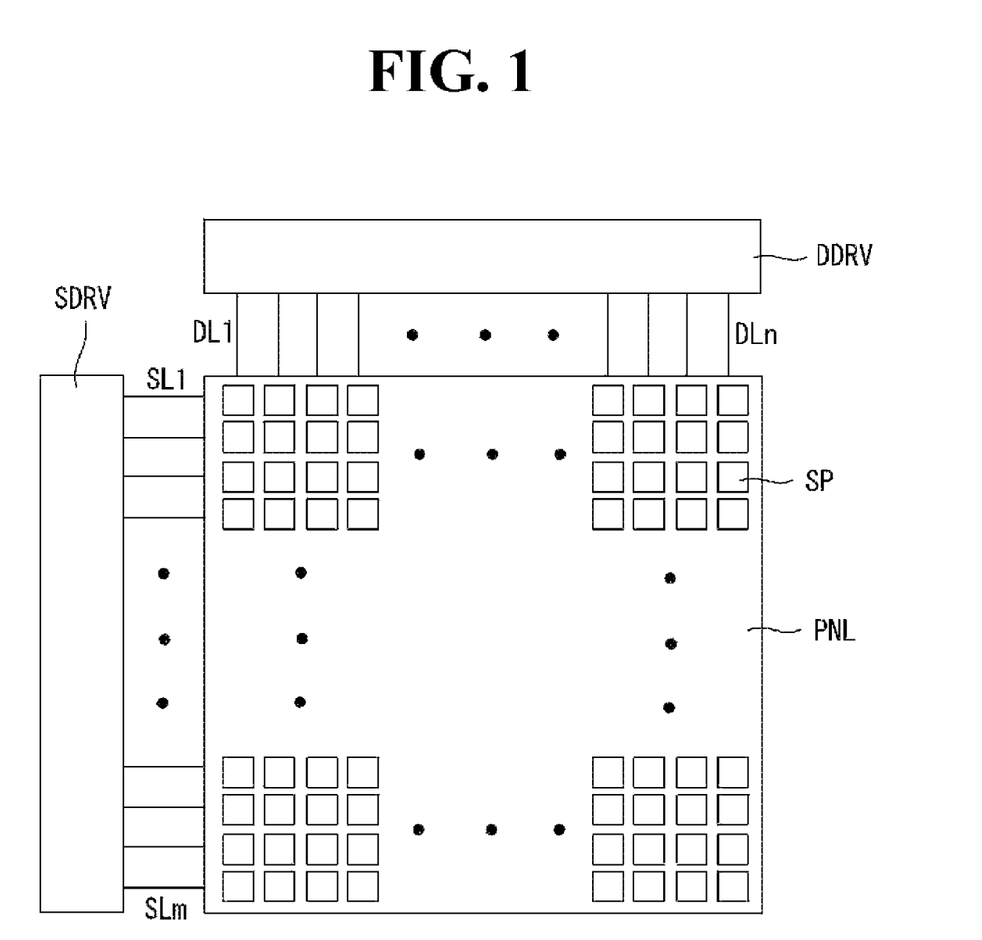
FIG. 1 is a schematic block diagram of an organic light emitting diode (OLED) display according to an embodiment of the invention.
Figure 2:
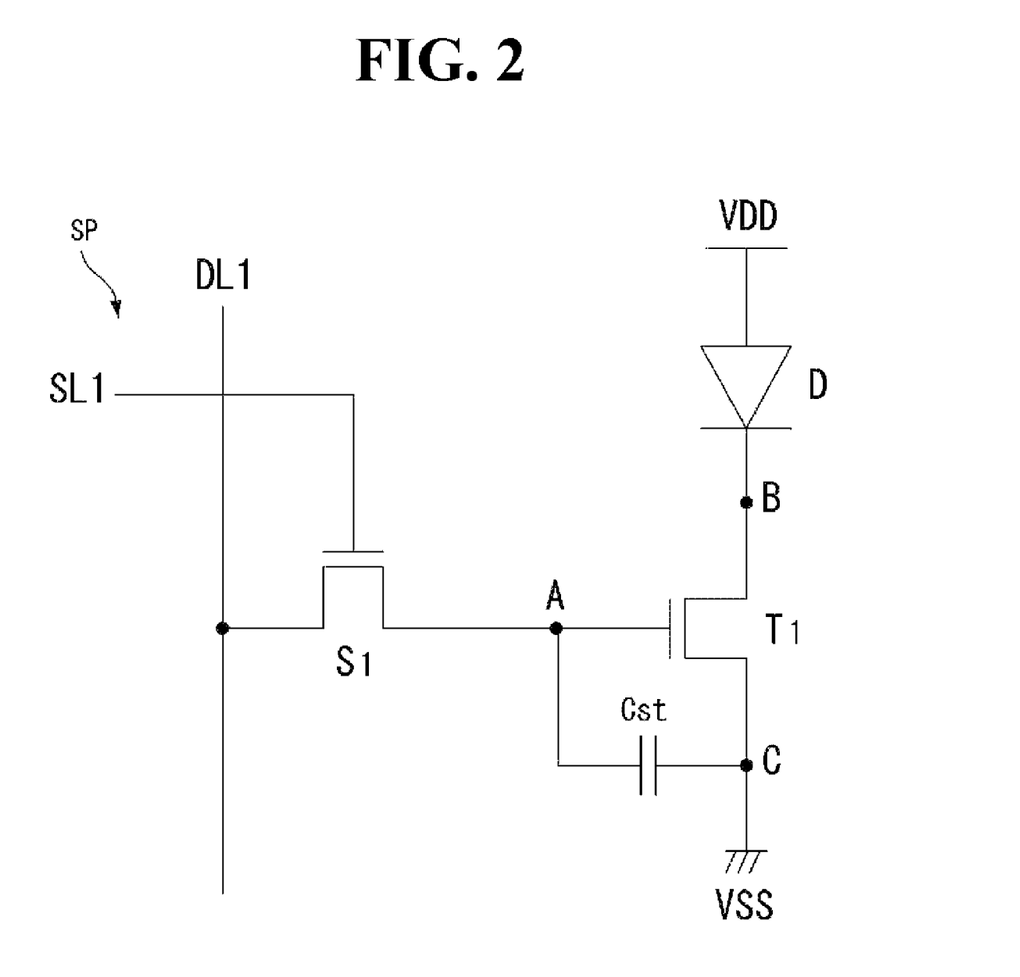
FIG. 2 illustrates a circuit configuration of a subpixel.

As shown in FIGS. 1 and 2, an organic light emitting diode (OLED) display according to an embodiment of the invention includes a panel PNL including a plurality of subpixels SP arranged in a matrix form, a scan driver SDRV supplying a scan signal to scan lines SL1 to SLm of the subpixels SP, and a data driver DDRV supplying a data signal to data lines DL1 to DLn of the subpixels SP.

The subpixels SP may be arranged in a passive matrix form or an active matrix form. When the subpixels SP are arranged in the active matrix form, each of the subpixels SP may have a 2T1C (T: transistor and C: capacitor) structure including a switching transistor S1, a driving transistor T1, a capacitor Cst, and an organic light emitting diode D or a structure adding a transistor and a capacitor to the 2TIC structure.

In each of the subpixels SP having the 2T1C structure, as shown in FIG. 2, a gate electrode of the switching transistor S1 is connected to the scan line SL1 receiving the scan signal, one terminal of the switching transistor S1 is connected to the data line DL1 receiving the data signal, and the other terminal of the switching transistor S1 is connected to a first node A. A gate electrode of the driving transistor T1 is connected to the first node A, one terminal of the driving transistor T1 is connected to a second node B, and the other terminal of the driving transistor T1 is connected to a third node C connected to a second power line VSS receiving a low potential power voltage. One terminal of the capacitor Cst is connected to the first node A, and the other terminal of the capacitor Cst is connected to the third node C. An anode electrode of the organic light emitting diode D is connected to a first power line VDD receiving a high potential power voltage, and a cathode electrode of the organic light emitting diode D is connected to the second node B and the one terminal of the driving transistor T1.

Although the explanation was given of an example of the n-type transistors S1 and T1 of each subpixel SP in the embodiment of the invention, the p-type transistors S1 and T1 may be used. Further, the high potential power voltage supplied through the first power line VDD may be greater than the low potential power voltage supplied through the second power line VSS. Levels of the voltages supplied through the first power line VDD and through the second power line VSS may be switched depending on a driving manner.

The above-described subpixel SP may operate as follows. When the scan signal is supplied through the scan line SL1, the switching transistor S1 is turned on. Then, when the data signal supplied through the data line DL1 is supplied to the first node A via the turned-on switching transistor S1, the data signal is stored in the capacitor Cst as a data voltage. Then, when the scan signal is cut off and the switching transistor S1 is turned off, the driving transistor T1 is driven according to the data voltage stored in the capacitor Cst. Then; when the high potential power voltage supplied through the first power line VDD flows through the second power line VSS, the organic light emitting diode D emits light. The embodiments of the invention are not limited to a driving method of the subpixel SP illustrated in FIG. 2. Other driving methods of each subpixel may be used for the embodiment of the invention.

The structure of the above-described OLED display is described below.

Figure 3:
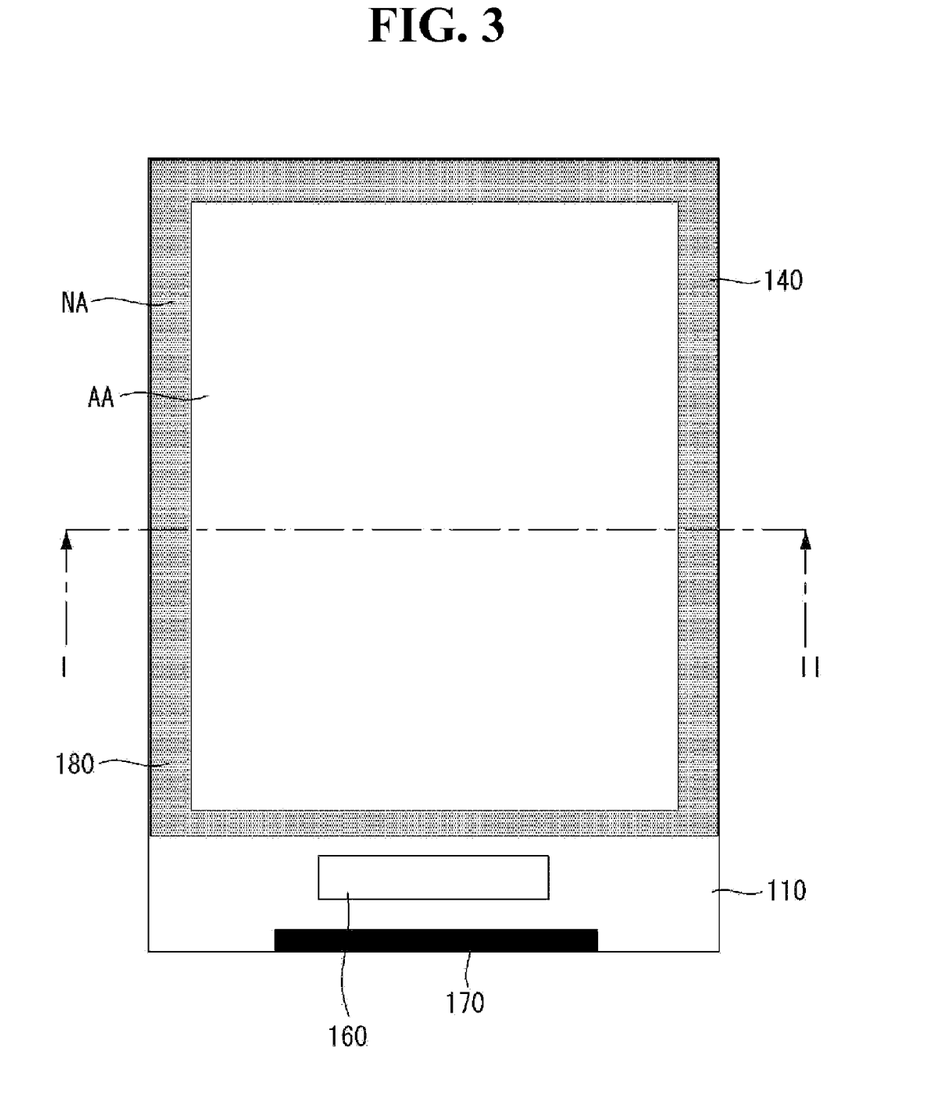
FIG. 3 is a plane view of an organic light emitting diode (OLED) display
Figure 4:
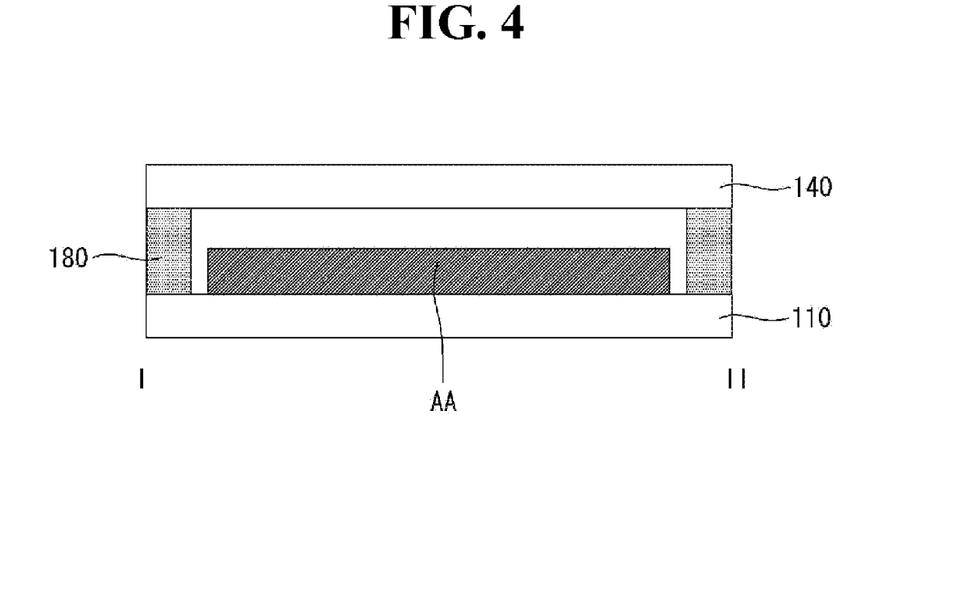
FIG. 4 is a cross-sectional view taken along line I-II of FIG. 3.

As shown in FIGS. 3 and 4, the OLED display according to the embodiment of the invention includes a substrate 110 having a display area AA defined by a plurality of subpixels arranged in an active matrix form and a sealing substrate 140 for protecting the plurality of subpixels on the substrate 110 from moisture and oxygen.

The substrate 110 and the sealing substrate 140 are attached to each other using an adhesive member 180 formed in a non-display area NA positioned outside the display area AA, and thus the substrate 110 and the sealing substrate 140 are sealed together. The OLED display includes a pad unit 170 outside the substrate 110 to receive various signals and various voltages from the outside. The OLED display drives a plurality of elements of a sealing structure of the substrate 110 and the sealing substrate 140 using a driving device 160 configured by one chip. The driving device 160 includes the data driver and the scan driver illustrated in FIG. 1, or other drivers. The OLED display according to the embodiment of the invention may be implemented by one of a top emission type OLED display, a bottom emission type OLED display, and a dual emission type OLED display.

The OLED display according to the embodiment of the invention is described in detail below with reference to FIGS. 5 to 9.

Figure 5:
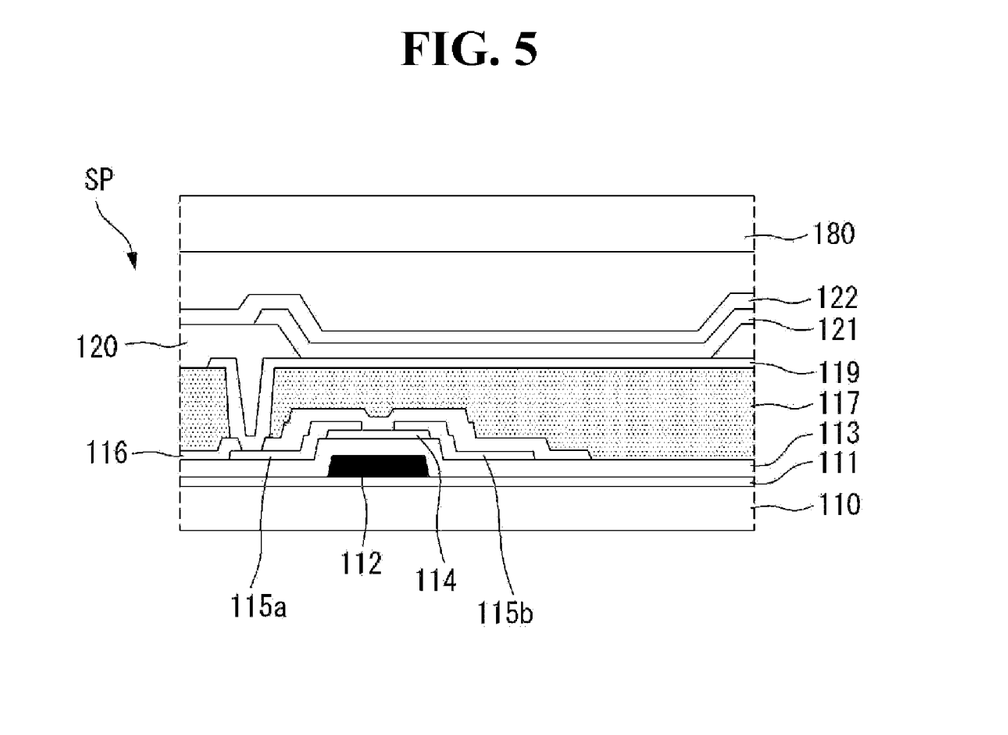
FIG. 5 is a cross-sectional view of a subpixel.

A buffer layer 111 is positioned on the substrate 110. The buffer layer 111 may protect a thin film transistor to be formed in a succeeding process from impurities (e.g., alkali ions discharged from the substrate 110). The buffer layer 111 may be formed using silicon oxide (SiOx) silicon nitride ($SiN_x$), or using other materials.

A gate electrode 112 is positioned on the buffer layer 111. The gate electrode 112 may be formed of any one selected from the group consisting of molybdenum (Mo), aluminum (Al), chromium (Cr), gold (Au), titanium (Ti), nickel (Ni), neodymium (Nd) and copper (Cu), or a combination thereof. The gate electrode 112 may have a multi-layered structure including any one selected from the group consisting of Mo, Al, Cr, Au, Ti, Ni, Nd and Cu, or a combination thereof. For example, the gate electrode 112 may have a double-layered structure including Mo/Al—Nd or Mo/Al.

A first insulating layer 113 is positioned on the gate electrode 112. The first insulating layer 113 may be formed of silicon oxide ($SiO_x$), silicon nitride ($SiN_x$), or a multi-layered structure or a combination thereof but is not limited thereto.

An active layer 114 may be positioned on the first insulating layer 113. The active layer 114 may be formed of amorphous silicon or crystallized polycrystalline silicon. Although it is not shown, the active layer 114 may include a channel region, a source region, and a drain region. The source region and the drain region of the active layer 114 may be doped with p-type impurities or n-type impurities. The active layer 114 may include an ohmic contact layer for reducing a contact resistance.

A source electrode 115a and a drain electrode 115b are positioned on the active layer 114. Each of the source electrode 115a and the drain electrode 115b may have a single-layered structure or a multi-layered structure. When the source electrode 115a and the drain electrode 115b have the single-layered structure, the source electrode 115a and the drain electrode 115b may be formed of any one selected from the group consisting of Mo, Al, Cr, Au, Ti, Ni, Nd and Cu, or a combination thereof. When the source electrode 115a and the drain electrode 115b have the multi-layered structure, the source electrode 115a and the drain electrode 115b may have a double-layered structure including Mo/Al—Nd or a triple-layered structure including Mo/Al/Mo or Mo/Al—Nd/Mo.

A second insulating layer 116 is positioned on the source electrode 115a and the drain electrode 115b. The second insulating layer 116 may be formed of silicon oxide ($SiO_x$), silicon nitride ($SiN_x$), or a multi-layered structure or a combination thereof. Other materials may be used. The second insulating layer 116 may be a passivation layer.

A third insulating layer 117 is positioned on the second insulating layer 116. The third insulating layer 117 may be formed of silicon oxide ($SiO_x$), silicon nitride ($SiN_x$), or a multi-layered structure or a combination thereof. Other materials may be used. The third insulating layer 117 may be a planarization layer.

So far, the explanation was given of an example of a bottom-gate type transistor as the driving transistor positioned on the substrate 110. The organic light emitting diode positioned on the driving transistor is described in detail below.

A first electrode 119 is positioned on the third insulating layer 117. The first electrode 119 may be selected as an anode electrode or a cathode electrode. When the first electrode 119 is selected as an anode electrode, the first electrode 119 may be formed of a transparent material such as indium-tin-oxide (ITO) and indium-zinc-oxide (IZO). Other materials may be used for the first electrode 119.

A bank layer 120 having an opening exposing a portion of the first electrode 119 is positioned on the first electrode 119. The bank layer 120 may be formed of an organic material such as benzocyclobutene (BCB)-based resin, acrylic resin, and polyimide resin. Other materials may be used.

Figure 6:
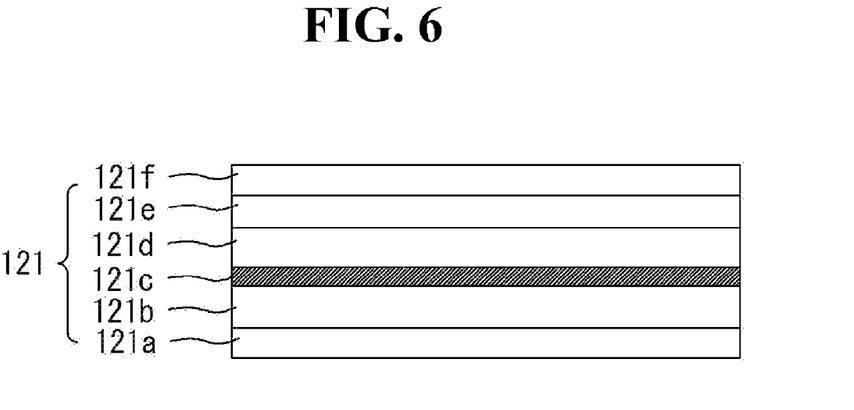
FIG. 6 illustrates a structure of an organic light emitting layer according to an embodiment of the invention.

An organic light emitting layer 121 is positioned inside the opening of the bank layer 120. The organic light emitting layer 121 includes an inorganic oxide layer between a light emitting layer and a common layer. The inorganic oxide layer may be positioned between the light emitting layer and a hole transport layer. As shown in FIG. 6, the organic light emitting layer 121 includes a hole injection layer 121a, a hole transport layer 121b, an inorganic oxide layer 121c, a light emitting layer 121d, an electron transport layer 121e, and an electron injection layer 121f.

The hole injection layer 121a may function to smoothly perform the injection of holes. The hole injection layer 121a may be formed of at least one selected from the group consisting of copper phthalocyanine (CuPc), PEDOT (poly(3,4)-ethylenedioxythiophene), polyaniline (PANI) and NPD (N,N-dinaphthyl-N,N'-diphenyl benzidine). Other materials may be used.

The hole transport layer 121b may function to smoothly perform the transport of holes. The hole transport layer 121b may be formed of at least one selected from the group consisting of NPD (N,N-dinaphthyl-N,N'-diphenyl benzidine), TPD (N,N'-bis-(3-methylphenyl)-N,N'-bis-(phenyl)-benzidine, s-TAD and MTDATA (4,4',4"-Tris(N-3-methylphenyl-N-phenyl-amino)-triphenylamine). Other materials may be used.

The inorganic oxide layer 121c may function to facilitate an energy transition between the hole transport layer 121b and the light emitting layer 121d and may be formed of any one of molybdenum oxide ($MoO_3$), tungsten oxide ($WO_3$), and tin oxide ($SnO_2$). Other materials may be used. A thickness of the inorganic oxide layer 121c may be approximately 20 Å to 60 Å. When the thickness of the inorganic oxide layer 121c is equal to or greater than 20 Å, the inorganic oxide layer 121c may prevent triplet from being injected into the hole transport layer 121b. Hence, the energy transition between the hole transport layer 121b and the light emitting layer 121d can be easily performed. When the thickness of the inorganic oxide layer 121c is equal to or less than 60 Å, the inorganic oxide layer 121c serves as an insulating layer. Hence, the inorganic oxide layer 121c may prevent triplet from being injected into the hole transport layer 121b while being prevented from serving as a barrier. As a result, the energy transition between the hole transport layer 121b and the light emitting layer 121d can be easily performed.

The light emitting layer 121d includes a host and a dopant. The light emitting layer 121d may be formed using a material capable of emitting red, green, blue, and white light, for example, a phosphorescence material or a fluorescence material. In case the light emitting layer 121d emits red light, the light emitting layer 121d includes a host material including carbazole biphenyl (CBP) or N,N-dicarbazolyl-3,5-benzene (mCP). Further, the light emitting layer 121d may be formed of a phosphorescence material including a dopant containing at least one selected from the group consisting of PIQIr(acac) (bis(1-phenylisoquinoline)acetylacetonate iridium), PQIr(acac)(bis(1-phenylquinoline)acetylacetonate iridium), PQIr(tris(1-phenylquinoline)iridium) and PtOEP(octaethylporphyrin platinum) or a fluorescence material containing PBD:Eu(DBM)3(Phen) or Perylene. Other materials may be used. In case the light emitting layer 121d emits green light, the light emitting layer 121d includes a host material containing CBP or mCP. Further, the light emitting layer 121d may be formed of a phosphorescence material including a dopant containing Ir(ppy)3(fac tris(2-phenylpyridine)iridium) or a fluorescence material containing Alq3(tris(8-hydroxyquinolino)aluminum). Other materials may be used. In case the light emitting layer 121d emits blue light, the light emitting layer 121d includes a host material containing CBP or mCP. Further, the light emitting layer 121d may be formed of a phosphorescence material including a dopant containing (4,6-F2 ppy)2Irpic or a fluorescence material containing any one selected from the group consisting of spiro-DPVBi, spiro-6P, distyryl-benzene (DSB), distyryl-arylene (DSA), PFO-based polymer, PPV-based polymer and a combination thereof. Other materials may be used.

The electron transport layer 121e may function to smoothly perform the transport of electrons. The electron transport layer 121e may be formed of at least one selected from the group consisting of Alq3(tris(8-hydroxyquinolino) aluminum, PBD, TAZ, Spiro-PBD, BAIq, and SAIq. Other materials may be used.

The electron injection layer 121f may functions to smoothly perform the injection of electrons. The electron injection layer 121g may be formed of Alq3(tris(8-hydroxyquinolino)aluminum), PBD, TAZ, Spiro-PBD, BAIq, SAIq, or LiF. Other materials may be used.

In the embodiment of the invention, at least one of the hole injection layer 121a, the hole transport layer 121b, the electron transport layer 121e, and the electron injection layer 121f may be omitted.

A second electrode 122 is positioned on the organic light emitting layer 121. The second electrode 122 may be selected as an anode electrode or a cathode electrode. When the second electrode 122 is selected as a cathode electrode, the second electrode 122 may be formed of aluminum (Al). Other materials may be used for the second electrode 122.

An experimental example of the organic light emitting diode according to the embodiment of the invention is described below.

As shown in FIGS. 5 to 8, the organic light emitting layer 121 of the organic light emitting diode according to the embodiment of the invention includes the hole injection layer 121a, the hole transport layer 121b, the inorganic oxide layer 121c, the light emitting layer 121d, the electron transport layer 121e, and the electron injection layer 121f.

When a phosphorescence material is selected as a dopant used in the light emitting layer 121d, an energy level of triplet of the dopant of the light emitting layer 121d is lower than an energy level of triplet of the hole transport layer 121b. Hence, a portion of electrons in the dopant of the light emitting layer 121d is not contributed to form an exciton, and is transferred to the hole transport layer 121b. However, in the embodiment of the invention, the inorganic oxide layer 121c prevents the portion of electrons from being transferred to the hole transport layer 121b.

The following Table 1 indicates a voltage, a luminous intensity, and CIE color coordinates x and y measured in each of a related art OLED display and the OLED display having the above-described structure according to the embodiment of the invention.

TABLE 1

| | Optical characteristics at 10 mA/cm² | | | |
| --- | --- | --- | --- | --- |
| | Voltage (volts) | Luminous intensity (cd/A) | CIE color coordinate x | CIE color coordinate y |
| Comparative example | 3.1 | 12 | 0.675 | 0.324 |
| Embodiment | 3.2 | 14.7 | 0.674 | 0.324 |

As indicated in the above Table 1, conditions of each of the layers 121a, 121b, 121c, 121d, 121e, and 121f included in the organic light emitting layer 121 in the embodiment of the invention is as follows: a thickness of the hole injection layer 121a is 50 Å, a thickness of the hole transport layer 121b is 700 Å, a thickness of the inorganic oxide layer 121c is 50 Å, in the light emitting layer 121d a thickness of a host is 450 Å and a dopant is 8%, a thickness of the electron transport layer 121e is 200 Å, and a thickness of the electron injection layer 121f is 10 Å. The inorganic oxide layer is omitted in the related art OLED display.

Figure 7:
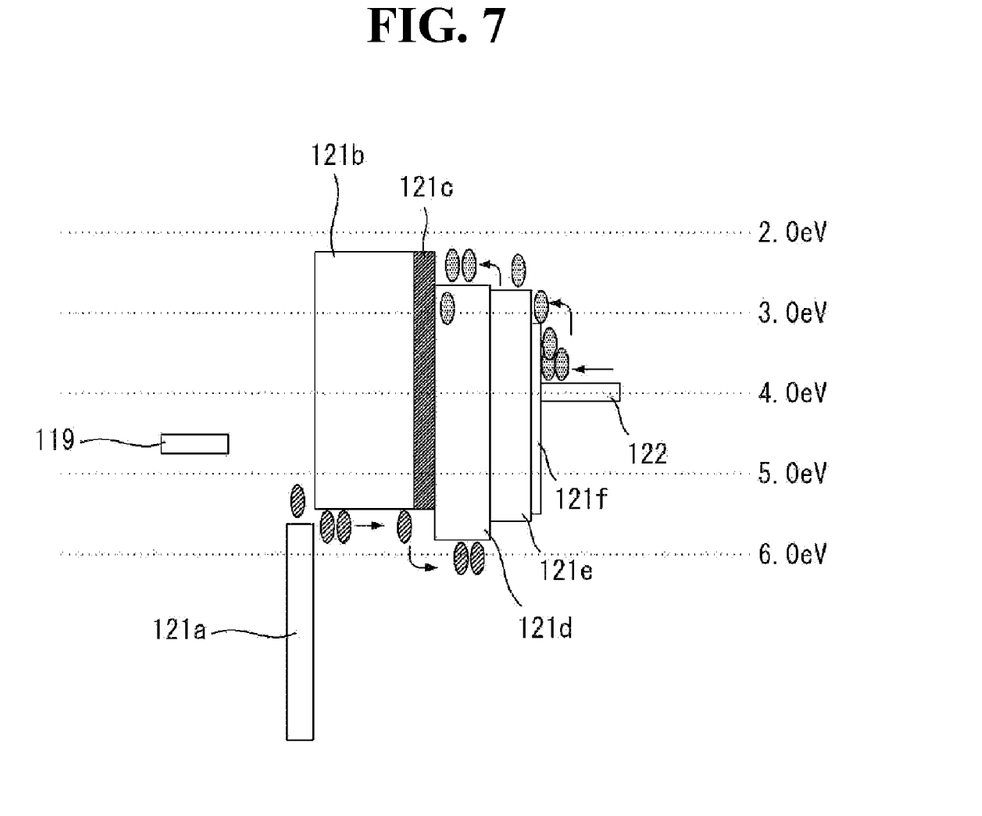
FIG. 7 illustrates an organic light emitting diode according to an embodiment of the invention.
Figure 8:
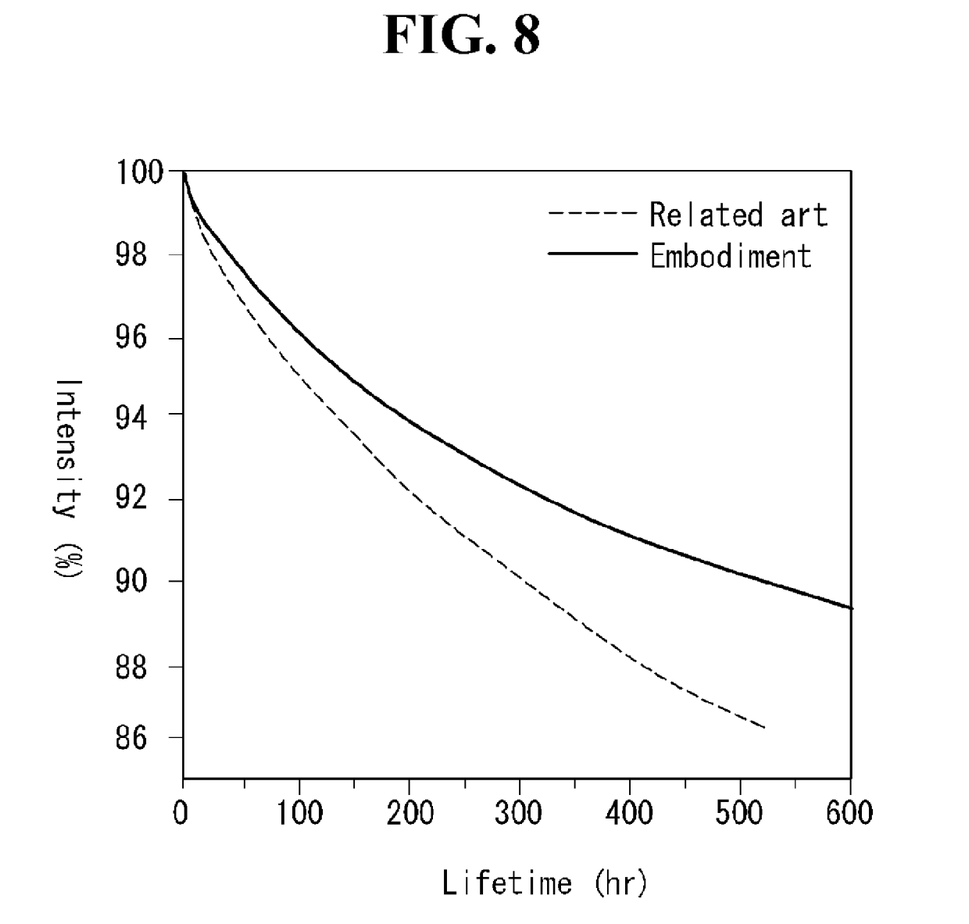
FIG. 8 is a graph illustrating lifetime of a related art and lifetime of an embodiment of the invention.

As shown in Table 1 and FIGS. 7 and 8, when the inorganic oxide layer 121c was formed between the hole transport layer 121b and the light emitting layer 121d, the embodiment of the invention and the related art had the similar optical characteristics in the optical characteristics of voltage and CIE color coordinates x and y. However, emission efficiency in the embodiment of the invention was greatly improved compared with the related art, and lifetime in the embodiment of the invention greatly increased compared with the related art.

As described above, in the OLED display according to the embodiment of the invention, an interface of the light emitting layer can be improved by forming the inorganic oxide layer between the hole transport layer and the light emitting layer. Further, an energy loss of triplet can be prevented, and the emission efficiency and lifetime can be improved.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode display comprising:
    a substrate;
    a first electrode positioned on the substrate;
    an organic light emitting layer positioned on the first electrode, the organic light emitting layer including an inorganic oxide layer between a light emitting layer and a common layer; and
    a second electrode positioned on the organic light emitting layer,
    wherein the common layer includes at least one of a hole injection layer, a hole transport transfer layer, an electron transport transfer layer, and or an electron injection layer,
    wherein the inorganic oxide layer is positioned between the light emitting layer and the hole transport layer,
    wherein a thickness of the inorganic oxide layer is approximately 20 Å to 60 Å,
    wherein the inorganic oxide layer is formed of tin oxide ($SnO_2$),
    wherein the light emitting layer includes the host and the dopant of the phosphorescence material, the inorganic oxide layer prevents a portion of electrons from being transferred to the hole transport layer,
    wherein the hole transport transfer layer is formed of MTDATA(4,4',4"-Tris(N-3-methylphenyl-N-phenyl-amino)-triphenylamine),
    further comprising:
        at least one transistor connected to the first electrode; and at least one capacitor for supplying a data voltage to the at least one transistor, wherein the at least one transistor comprises a gate electrode, a source electrode and a drain electrode,
        wherein the gate electrode have a double-layered structure including Mo/Al—Nd or Mo/Al, the source electrode and the drain electrode have a double-layered structure including Mo/Al—Nd or a triple-layered structure including Mo/Al/Mo or Mo/Al—Nd/Mo.

2. A method of manufacturing an organic light emitting diode display comprising:
    forming a first electrode on a substrate;
    forming an organic light emitting layer on the first electrode; and
    forming a second electrode on the organic light emitting layer,
    wherein the forming of the organic light emitting layer includes forming an inorganic oxide layer between a light emitting layer and a common layer,
    wherein the common layer includes at least one of a hole injection layer, a hole transport transfer layer, an electron transport transfer layer, and or an electron injection layer,
    wherein the inorganic oxide layer is positioned between the light emitting layer and the hole transport layer,
    wherein a thickness of the inorganic oxide layer is approximately 20 Å to 60 Å,
    wherein the inorganic oxide layer is formed of tin oxide ($SnO_2$),
    wherein the light emitting layer includes the host and the dopant of the phosphorescence material, the inorganic oxide layer prevents a portion of electrons from being transferred to the hole transport layer,
    wherein the hole transport transfer layer is formed of MTDATA(4,4',4"-Tris(N-3-methylphenyl-N-phenyl-amino)-triphenylamine),
    further comprising, before forming the first electrode on the substrate, forming a transistor unit including at least one transistor connected to the first electrode and at least one capacitor for supplying a data voltage to the at least one transistor,
    wherein the at least one transistor comprises a gate electrode, a source electrode and a drain electrode,
    wherein the gate electrode have a double-layered structure including Mo/Al—Nd or Mo/Al, the source electrode and the drain electrode have a double-layered structure including Mo/Al—Nd or a triple-layered structure including Mo/Al/Mo or Mo/Al—Nd/Mo.

* * * * *